United States Patent
Perez de Leon

(10) Patent No.: US 10,131,989 B2
(45) Date of Patent: Nov. 20, 2018

(54) METHOD OF GROWING A NANOTUBE INCLUDING PASSING A CARBON-BASED GAS THROUGH FIRST AND SECOND OPENINGS OF A TUBE

(71) Applicant: The United States of America, as represented by the Secretary of the Navy, Washington, DC (US)

(72) Inventor: Ignacio Maria Perez de Leon, Dunkirk, MD (US)

( * ) Notice: Subject to any disclaimer, the term of this patent is extended or adjusted under 35 U.S.C. 154(b) by 126 days.

(21) Appl. No.: 15/072,386

(22) Filed: Mar. 17, 2016

(65) Prior Publication Data

US 2017/0022062 A1    Jan. 26, 2017

Related U.S. Application Data

(60) Provisional application No. 62/177,518, filed on Mar. 17, 2015.

(51) Int. Cl.
| | |
|---|---|
| *C23C 16/26* | (2006.01) |
| *B01J 27/00* | (2006.01) |
| *C23C 16/04* | (2006.01) |
| *C01B 32/162* | (2017.01) |
| *B01J 23/70* | (2006.01) |
| *B01J 37/02* | (2006.01) |

(52) U.S. Cl.
CPC .............. *C23C 16/26* (2013.01); *B01J 23/70* (2013.01); *B01J 27/00* (2013.01); *B01J 37/0217* (2013.01); *C01B 32/162* (2017.08); *C23C 16/045* (2013.01)

(58) Field of Classification Search
CPC ............................. C23C 16/26; C23C 16/4584
See application file for complete search history.

(56) References Cited

U.S. PATENT DOCUMENTS

| | | | | |
|---|---|---|---|---|
| 2006/0240974 A1* | 10/2006 | Hongo | ................... | B01J 21/063 502/60 |
| 2007/0003471 A1* | 1/2007 | Kawabata | .............. | B82Y 30/00 423/447.3 |
| 2008/0018012 A1* | 1/2008 | Lemaire | ................. | B82Y 30/00 264/82 |
| 2008/0182027 A1* | 7/2008 | Vasenkov | .............. | B82Y 30/00 427/450 |
| 2009/0035209 A1* | 2/2009 | Kondo | ................... | B82Y 30/00 423/447.1 |
| 2009/0311166 A1* | 12/2009 | Hart | ......................... | B82B 1/00 423/445 B |
| 2011/0100955 A1* | 5/2011 | Pushparaj | .............. | B82Y 10/00 216/37 |

(Continued)

OTHER PUBLICATIONS

Jourdain, Vincent, et al., "Current understanding of the growth of carbon nanotubes in catalytic chemical vapour deposition". Carbon 58 (2013) 2-39.*

(Continued)

*Primary Examiner* — Bret P Chen
(74) *Attorney, Agent, or Firm* — Michael Badagliacca

(57) ABSTRACT

A method includes providing a substrate including a tube with a first opening a second opening, depositing a metal film onto a portion of the tube near the first opening, and growing a carbon nanotube by passing a carbon-based gas through the tube and metal film. The gas enters the tube through the second opening and exits the tube through the first opening.

20 Claims, 2 Drawing Sheets

(56) References Cited

U.S. PATENT DOCUMENTS

2011/0311427 A1* 12/2011 Hauge .................. B82Y 30/00
423/325
2012/0263951 A1* 10/2012 Mueller ................ H01B 1/104
428/364
2013/0160701 A1* 6/2013 Arnold .................. B82Y 40/00
117/95

OTHER PUBLICATIONS

Han, Young-Soo, et al., "Synthesis of carbon nanotube bridges on patterned silicon wafers by selective lateral growth". Journal of Applied Physics, vol. 90, No. 11, Dec. 1, 2001, pp. 5731-5734.*
Jodin, Lucie, et al., "Influence of the Catalyst Type on the Growth of Carbon Nanotubes via Methane Chemical Vapor Deposition". J. Phys. Chem. B 2006, 110, 7328-7333.*
Gao, Jing, et al., "Revealing the Role of Catalysts in Carbon Nanotubes and Nanofibers by Scanning Transmission X-ray Microscopy". Scientific Reports, 4: 3606, pp. 1-6.*
Chester, et al., CVD Growth of Continuous Carbon Nanotube Arrays in Segregated Reactant Flow, AICChE 2013.

\* cited by examiner

METHOD OF GROWING A NANOTUBE INCLUDING PASSING A CARBON-BASED GAS THROUGH FIRST AND SECOND OPENINGS OF A TUBE

CROSS-REFERENCE

This Application claims the benefit of priority under 35 U.S.C 119 based on provisional application No. 62/177,518 filed on Mar. 17, 2015. The Provisional Application and all references cited herein are hereby incorporated by reference into the present disclosure in their entirety.

TECHNICAL FIELD

The embodiments relate to growing nanotubes of various types.

BACKGROUND

In a related method of forming a carbon nanotube (CNT), a metal, for example, a transition metal such as Fe, Co, Ni or many others, is deposited on a solid substrate (typically Alumina or anodic aluminum oxide (AAO)). Heat is applied to break the metal film into a plurality of catalyst particles. In a chemical vapor deposition reactor operating at an appropriate temperature, pressure and gas composition, a carbon containing gas such as ethylene, or other hydrocarbon gas drifts over the catalyst particles and some molecules deposit onto their surface. Carbon containing species diffuse and decompose within the catalyst particle to ultimately crystallize into CNTs which grow out of the catalyst particles.

In another related method, a porous substrate is provided. This substrate may be formed by exposing an aluminum substrate to an acid treatment in an electrolytic bath, thereby forming the pores. These pores have one opening, and are solid on the bottom. Intermetallic catalyst particles are deposited electrolytically at the bottom of the pores. Gas is passed over the substrate, as described above, and the CNTs grow within the pores.

Wetting is not a desired property in these methods. Instead, lack of wetting is necessary in order to favor the beading of a thin catalyst film into small nanospheres during a thermal treatment process (in a Hydrogen/Helium atmosphere) which is crucial for CNT growth.

During gas phase CVD growth, when two nanotubes touch each other, there will be a driving force trying to increase their contact surface, ultimately forcing the CNTs to adhere to one another. The catalyst engine will stall when the catalyst particle of one of the CNTs touches and immerses in the other CNT.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The embodiments include a method including providing a substrate, the substrate including a first surface, a second surface opposite the first surface, and a tube with a first opening at the first surface and a second opening at the second surface; depositing a catalyst onto a portion of the tube near the first surface; and growing a nanotube, comprising passing a carbon-based gas through the tube, the carbon-based gas entering the tube through the second opening and exiting the tube through the first opening. The embodiments further include a method of growing a nanotube, including providing a substrate having a tube; and passing a carbon-based gas through the tube.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

Figure 1:
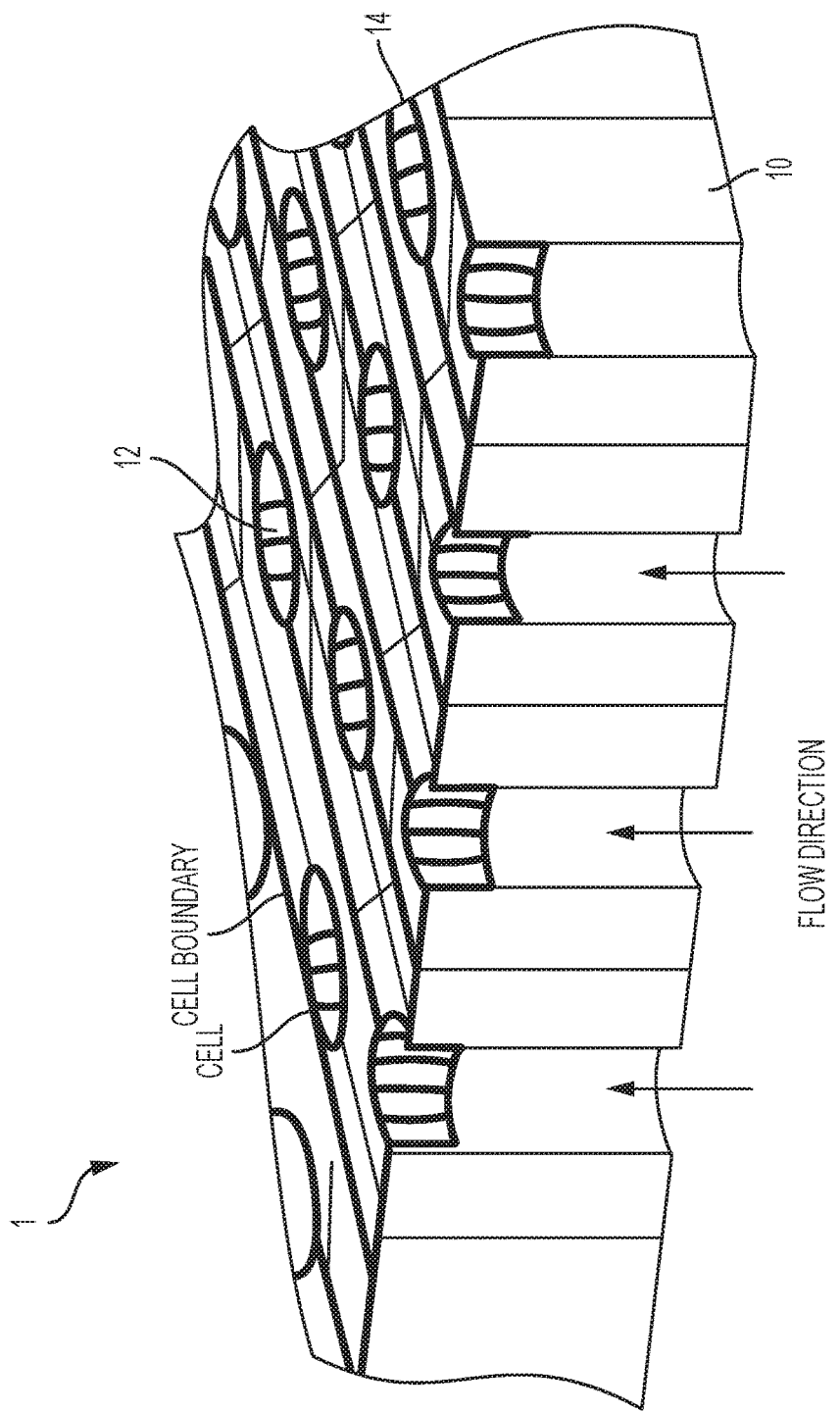
FIG. 1 is a cross-sectional view of a nanotube growth chamber used in accordance with a described embodiment.

FIG. 1 is a cross-sectional view of a nanotube growth chamber 1 used in accordance with a described embodiment. The chamber 1 includes a porous substrate 10, made of, for example Alumina. The substrate 10 includes a plurality of cells, each having a pore 12. A diameter of the pores may be, for example, 10-50 nm. The pores 12 have openings at top and bottom sides of the substrate 10, thereby forming continuous tubes.

A method of forming nanotubes on the chamber 1 will now be described. As non-limiting examples, these nanotubes may be CNT, Hexavalent Boron Nitride h-BN, or Molybdenum disulphide MoS2.

The substrate surface is treated to enhance wetting or bonding to a metallic thin film deposited on it. A catalyst metal film 14 (for example Fe, Co, Ni, Cu, Mo or their alloys, although many other metals or alloys may be used) is deposited on the substrate surface and partially into the pores 12 by any of a multitude of methods such as by evaporation or sputtering. There may also be a pre-treatment using, for example, a Ti oxide film, to promote catalyst adhesion or wetting of catalyst film. The deposition may occur at an angle relative to a longitudinal axis of the pores 12 to limit the coverage. The substrate 10 may be rotated about the longitudinal axis so that the deposition around the circumference of the pores 12 is symmetric. However, the thickness of the deposited metal may be greater at the top of the pores 12.

Figure 2:
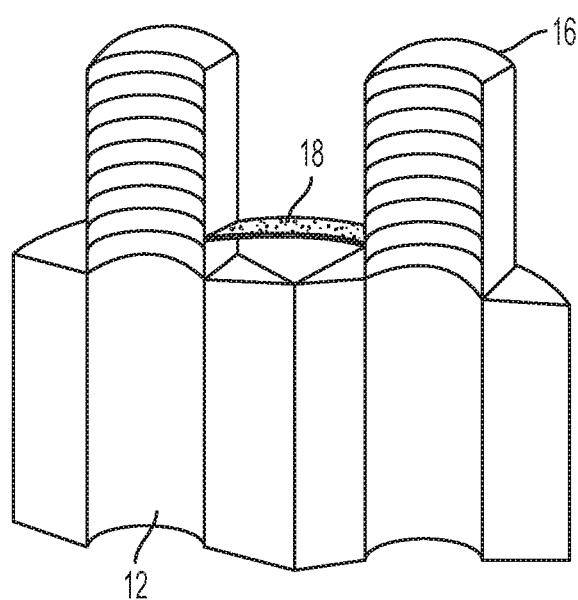
FIG. 2 is a cross-sectional view of the nanotube growth chamber of FIG. 1, with nanotubes.

Next, ethylene, or other hydrocarbon gas (such as methane or acetylene) is passed from the bottom of the substrate 10 so that the gas exits on the side of the substrate 10 having the film 14 (direction indicated in FIG. 1). Carbon containing molecules from the gas deposit and diffuse throughout the entire catalyst surface (which covers the entire substrate surface and partially the pores 12) ultimately crystallizing into a graphene-like hexagonal structure which is the precursor to the nanotubes. As shown in FIG. 2, the nanotubes 16 will grow upward from the pores 12. However, there will also be a graphene like-bridge 18 between the tubes 16.

Initially, this bridge 18 will be on the substrate surface, but will move upward with the growing tubes 16.

Advantages of this method as compared to the other described methods include better utilization of the gas since all the gas (and the chemicals therein) is channeled through the pores 12 as opposed to over or around the catalyst. Also, by beginning with pores 12 of regular sizes, you alleviate problems associated with different growth rates of different particles (fast growers rip slow growers out/slow growers hold fast growers back). Furthermore, the pressure of the flowing gas tends to keep the nanotubes straight. Still further, the bridge between tubes helps maintain positional stability.

Also, it is possible to decouple the diameter of the nanotubes from the number of walls that form its thickness. This is done by controlling the diameter of the pore size and the amount of deposited metal. This is different from using particles, in which the diameter and wall thickness are tied together. Specifically, a small particle will yield a small diameter and fewer walls. The described process allows decoupling of the diameter from the number of walls, in which additional walls can be added as needed.

Additional features and/or more specific aspects of the above will now be discussed.

A heating operation may be implemented to heat the catalyst 14 directly. The heating operation may minimize carbonaceous deposits along the pores 12 which would cause clogging. The heating operation will also simplify the segregated flow reactor construction since most of the components will be at room or moderate temperatures and ordinary construction materials could be used. Furthermore, substrate thickness could be made arbitrarily thick without worrying about clogging, however, if necessary the temperature of the substrate 12 will be kept cool by adjusting the relative concentrations of the gases. The thicker the substrate 12, the more rigid, and the larger the pressure differential that it can support. The substrate 12 may also be heated to activate the different precursor gases but it should be below the pyrolysis temperature to minimize carbonaceous deposits.

As an example, catalyst temperature growth conditions may be between 600-1200° C. The actual catalyst temperature is dictated by various processes including: conductive cooling by the substrate 12; entropic cooling by the crystallization of the nanotubes 16; by the heating of the catalyst surface from hydrocarbon decomposition on the catalyst surface; by heat exchange from the nanotube 16 outside the pores 12; by flowing gases through the pores 12 and finally by the inductive heating of the catalyst 14 (which may be controlled by the amplitude and frequency of an applied electromagnetic field).

As an example, inductive heating may be used. The induced vortical electron flow would foster crystallinity and growth rate of the nanotubes 16 by accelerating mixing and dispersion in the catalyst. Also, the growing nanotubes 16 will be inductively heated during growth, minimizing conductive losses therethough. The inductive heating may only heat the catalyst 14 (the substrate 12 is heated secondarily by thermal conduction), therefore there is a reduced chance of substrate contamination. As another example, laser heating may be used.

It is further noted that clogging may be avoided by minimizing thermal decomposition of the carbon precursor along the pores 12. For example, at ordinary temperature acetylene undergoes very slow spontaneous decomposition. Rapid decomposition sets in at, for example, 780° C., and in the presence of copper powder (as a catalyst) from 400°-500° C. Therefore, for acetylene, a processing temperature for the catalyst lower than, for example, 780° C. but higher than, for example, 500° C. would keep the catalyst active while avoiding carbon soot deposits along the pores 12.

Features of the catalyst 14 will now be discussed. Almost all metallic elements and alloys have been shown to catalyze the growth CNTs under appropriate conditions. The catalyst 14 may be a continuous thin film. However, in order to achieve a continuous film, wetting may be required. Thus, another consideration when selecting the catalyst 14 may be the ease with which the metal catalyst can be made by wetting towards the substrate 10. Wetting may be improved by adding an appropriate intermediate layer (not shown). This intermediate layer bonds well to the substrate 12 and is wetting against the catalyst 14. As examples, the intermediate layer may be made of titanium, to form a titanium oxide interface with alumina (if used) and a wetting interface with the catalyst 14. Depending on the catalyst, the interfacial layer will have to be optimized. The beneficial effects of the interfacial layer on wettability have been addressed as due to two reasons: a reduction of interface energy contributed by the negative free energy of the chemical reaction between the reactive element and the substrate, and by the formation of a reaction product at the liquid-substrate interface.

The wetting process may factor in determining the length of the pores 12. Too short of a catalyst segment and very little carbon might enter the catalyst to sustain appropriate growth conditions. Too long of a catalyst segment and the nanotubes 16 will not emerge and grow due to excessive viscous drag against the molten catalyst. Also, too much carbon might enter the catalyst 14 via the entire surface (temporality increasing the heating rate, the temperature and the activity in a runaway process) while very little carbon might leave the catalyst via condensation at the circumferential nanotube boundary. For stable growth conditions the amount of carbon entering and leaving the catalyst should balance.

The catalyst thickness may also be considered. Too thin of a layer and the catalytic activity might be diminished due to the influence of the adhesion chemistry on the activity of the catalyst. The diffusivity of carbon will be diminished possibly poisoning the catalyst. The viscosity will increase slowing or stopping the nanotube growth the electrical conductivity might decrease making it more difficult to control inductively. Too thick of a layer and the catalyst might start sagging or even closing.

Thus, the application of the catalyst film over the entire surface of the AAO substrate surface does not require thermal processing in a reducing environment for beading purposes. The catalyst may be deposited partially into the pores 12 by mounting substrate 12 on a rotating surface, such as a platform (not shown) that is set at a fixed angle relative to the catalyst evaporation source.

It is also possible to provide a second catalyst deposition with the rotating platform at a much higher angle so as to cover the entire surface with a thin catalyst layer. For a relatively thin layer and for an adequate pressure differential between the precursor gas chamber and the growth chamber, it would be possible to penetrate straight through the coating to achieve CNT growth.

The diameter of the pores 12 will now be discussed. The pore diameter may affect the diameter of the CNTs and therefore the ultimate attributes of the materials (such as the maximum current carrying capacity, cooling effectiveness and load carrying capacity to name a few). The diameter of the pore may also affect CNT growth. Together with the temperature and the processing gases, the pore diameter dictates the type of flow through the pores. If the mean free path is larger than the pore diameter a more random type of molecular flow will develop within the pore. If the mean free path is much smaller than the pore diameter a more standard continuum flow will develop. With this type of flow the processes should be more controllable and reproducible.

Other factors can also weigh in when choosing the pore diameter. If the pore diameter is too small it might get clogged easily from amorphous carbon deposits or there might be selective filtering against large molecules. Too large of a pore diameter and too much hydrocarbon might exit the pore and remain unreacted.

The processing gases will now be discussed. The substrate 12 naturally divides the processing reactor into two regions, the CNT growth region and the feedstock gas region. For example, one could add carbon precursor gases, carrier gas and amorphous carbon removal gas in to the feedstock region while the CNT binding compounds or lubricants and even the catalyst precursor gases are added into the CNT growth region.

Additional results of the above-described features will now be discussed.

Using a substrate 10 (for example, an AAO substrate) having nanopores allows improved control of segregations of gases with different functions (such as CNT growth gases as opposed to CNT-CNT binding or lubricity compounds). Also improved are CNT growth geometry, a real distribution, size, diameter of the catalyst growth sites, and immobilization of the catalyst. Feedstock precursor gasses may be supplied directly to the catalyst, and the resulting forces drive the CNTs out of the catalyst and pore. These results are at least due to having a nanopore array with a regular geometry. The carbon precursor gasses and catalyst repletion gasses may be added independently from both chambers. By using carbon precursor gases, catalyst depletion through evaporation or via nanotube extraction can be replenished. It is possible to supply precursor gases and other gases (such as repletion gasses) from both sides of the substrates.

One example of the gas sequencing will now be discussed. First, deliver hydrocarbon precursor from the growth chamber to generate a conformal graphitic layer over the entire substrate surface and into the pores 12. After a graphitic monolayer has crystallized over the entire substrate surface and into the pores 12, stop the supply of hydrocarbon from the growth side and switch to supplying gases (hydrocarbons, carrier gases, catalyst precursor gases, amorphous carbon deposits removal gases, others) from the formal supply side.

A continuous film of catalyst 14 (for example, a few nanometers thick) deposited over the entire surface of the substrate 12 will mimic the underlying geometry and topology yielding multiple sites for effective growth conditions. All the nanotubes will have similar diameters, growing ultimately at similar rates with less likelihood for quenching growth due to CNT-CNT interactions.

The diameter of the nanotubes may be controlled independently from the number of walls in the nanotubes. If the nanotube growth is from the cylindrical surface (inside the pore) then the nanotube will tend to have a single wall. However, if the nanotube growth is closer to the top edge of the pore 12, then faster surface carbon diffusion will favor several walls. Also, additional catalyst 14 might be deposited to immerse the growing nanotube 16 and provide new catalyst surface for a new nanotube.

Also, by properly controlling the concentration of carbon precursor gases over time (or even by inserting carbon precursor gases in the nanotube growth side) it may be possible to cover the entire surface of the catalyst 14 with a monolayer of graphene (not shown) prior to nanotube growth. This monolayer will help the individual nanotube filaments maintain their relative position during the subsequent growth phase. This initial graphene monolayer also provides a mechanism for vertical nanotube growth right from the beginning (eliminating the formation of the cake region).

Insofar as the growth rate of nanotubes depends on the nanotube chiral angle, in order to achieve uniform growth velocity, one should feed precursor gases at a concentration, pressure differential and catalyst temperature slightly higher than that necessary to achieve the maximum growth velocity for that catalyst temperature. These parameters may then slowly be adjusted until maximum growth equilibrium is achieved.

The pores 12 never merge and the nanotubes 12 accordingly do not contract each other as a result of the outgoing transport gas, which tends to keep the nanotubes straight. There is little or no need for Oswald Ripening or other quenching mechanisms. If further alignment is necessary, it is possible to apply a voltage or a current to the nanotubes 16 by connecting the power source terminal anywhere on the catalyst 14.

Segregated gas flow is possible, resulting in more control of the process gases. For example, a hydrocarbon precursor gas can be supplied from one side, while catalyst replenishing gases can be supplied from the other side, avoiding cross contamination. Also, an argon (as an example of an inert carrier gas) flow may be provided to pull the nanotubes out of the pores 12 and out of the catalyst. The argon that flows through the pores 12 and keeps the nanotubes 16 straight; and at the same time keeps them somewhat separated from one another avoiding negative drag effects. After sufficient length, rollers and lubricating agents may be used for steady growth conditions.

Also, it is possible to add other materials in the growth side (such as nanotube binders or lubricants) without contaminating the catalyst 14 or clogging the pores 12. Nanotube growth may be patterned by closing pores through standard photolithographic methods.

The number of walls that make up the nanotubes 16 may be controlled by adjusting the catalyst geometry (length, diameter and thickness). It is possible to control the nanotube diameter independently from the catalyst thickness by starting and locking the growth at some catalyst thickness followed by catalyst addition to immerse the nanotube.

As discussed above, rather than growing CNTs by flowing precursor chemicals around nanometer-sized spherical catalyst particles, the described embodiments create a nanometer-sized cylindrical catalyst and flow the precursor chemicals through the pores of the catalyst. The precursor chemicals are channeled through the catalyst particle, resulting in better utilization of said chemicals. Also, the catalyst is anchored to the substrate chemically and also by the texture of the substrate.

Although particular embodiments, aspects, and features have been described and illustrated, it should be noted that the invention described herein is not limited to only those embodiments, aspects, and features. It should be readily appreciated that modifications within the spirit and scope of the underlying invention described and claimed herein may be made by persons skilled in the art, and all such combinations and embodiments are deemed to be within the scope and spirit of the present disclosure.

What is claimed is:

1. A method comprising:
providing a substrate, the substrate comprising:
a first surface,
a second surface opposite the first surface, and
a plurality of tubes each with a first opening at the first surface and a second opening at the second surface;
depositing a catalyst onto a portion of the tube near the first surface; and
growing a plurality of nanotubes, comprising passing a carbon-based gas through the tubes, the carbon-based gas entering the respective tube through the respective second opening and exiting the tube through the respective first opening,
wherein a bridge connects at least two of the nanotubes, the bride being comprised of carbon from the gas.

2. The method of claim 1, further comprising depositing the catalyst over the entire first surface and partially into the tubes.

3. The method of claim 2, further comprising depositing a layer of graphene over the catalyst prior to the growing the nanotubes.

4. The method of claim 2, further comprising:
rotating the catalyst-deposited substrate; and
depositing additional catalyst onto the rotating catalyst-deposited substrate.

5. The method of claim 1, wherein the depositing the catalyst comprises depositing the catalyst at an angle relative to a longitudinal axis of the tubes.

6. The method of claim 5, further comprising rotating the substrate during the depositing of the catalyst.

7. The method of claim 1, further comprising:
controlling a diameter of the nanotubes comprising controlling a diameter of the tubes; and
controlling a thickness of the nanotubes comprising controlling an amount of the catalyst deposited during the depositing.

8. The method of claim 1, further comprising wetting of the catalyst.

9. The method of claim 8, further comprising treating the entire first surface of the substrate to enhance the wetting of the catalyst.

10. The method of claim 1, further comprising depositing additional catalyst to immerse the growing nanotubes.

11. The method of claim 1, further comprising passing a catalyst-replenishing gas through the respective tube,
the catalyst-replenishing gas entering the respective tube through the respective first opening and exiting the tube through the respective second opening.

12. The method of claim 1, further comprising heating the catalyst by inductive heating without heating the substrate by inductive heating.

13. The method of claim 1, wherein a diameter of the nanotubes is independent of a thickness of the nanotubes.

14. The method of claim 13, wherein each of the nanotubes comprise a plurality of walls, and the diameter of the respective nanotube corresponds to a diameter of the respective tube and the thickness of the respective nanotube corresponds to a number of the walls.

15. The method of claim 14, wherein a diameter of the nanotubes is independent of a thickness of the nanotubes.

16. The method of claim 1, wherein the catalyst is anchored to the substrate chemically and by a texture of the substrate.

17. The method of claim 1, wherein the bridge is comprised of a same material as the nanotubes.

18. A method comprising:
providing a substrate, the substrate comprising:
a first surface,
a second surface opposite the first surface, and
a tube with a first opening at the first surface and a second opening at the second surface;
depositing a catalyst onto a portion of the tube near the first surface; and
growing a nanotube, comprising passing a carbon-based gas through the tube, the carbon-based gas entering the tube through the second opening and exiting the tube through the respective first opening,
wherein the substrate further comprises a plurality of the tubes and the growing comprises growing a plurality of the nanotubes,
the method further comprises depositing the catalyst over the entire first surface and partially into the tubes, and
a bridge connects the nanotubes, the bride having a hexagonal structure.

19. A method of growing a plurality of nanotubes, comprising:
providing a substrate having a plurality of tubes; and
passing a carbon-based gas through the tubes,
a bridge having a hexagonal structure connecting the nanotubes.

20. The method of claim 19, further comprising:
depositing a catalyst on a surface of the substrate and in the tubes.

* * * * *